SEMICONDUCTOR DEVICES

Original Filed Jan. 6, 1961 3 Sheets-Sheet 1

INVENTOR
PER GUSTAF JOHANNES SVEDBERG
by
Bailey, Stephens & Huettig
ATTORNEYS

INVENTOR
PER GUSTAF JOHANNES SVEDBERG
by Bailey, Stephens & Huettig
ATTORNEYS

Inventor
Per Gustaf Johannes Svedberg
by Bailey, Stephens & Huettig
Attorneys

United States Patent Office

Re. 26,428
Reissued July 16, 1968

26,428
SEMICONDUCTOR DEVICES

Per Gustaf Johannes Svedberg, Vallingby, Sweden, assignor to Allmänna Svenska Elektriska Aktiebolaget, Vasteras, Sweden Original No. 3,140,963, dated July 14, 1964, Ser. No. 81,147, Jan. 6, 1961. Application for reissue Oct. 15, 1965, Ser. No. 496,731

4 Claims. (Cl. 148—33.1)

Matter enclosed in heavy brackets [ ] appears in the original patent but forms no part of this reissue specification; matter printed in italics indicates the additions made by reissue.

*ABSTRACT OF THE DISCLOSURE*

*A semi-conductor device of the Esaki type having five semi-conductor zones of alternating P- and N-type conductivity being symmetrically arranged. The doping concentrations in the five zones being the highest in the outer zones and the lowest in the central zone, with the intermediate zones exhibiting a mean concentration value. The doping concentrations between the outermost layers and the intermediate layers being sufficient to establish a junction thickness of 100 to 200 Angstrom units and to exhibit the so called tunnel effect.*

In the art of electrotechnics, particularly in connection with different control circuits, it has been desirable to produce a semiconductor switch which can be brought to conduct electric current in both directions. The switch elements hitherto known are, before all, the three-zone transistor and the four-zone PNPN switch defined as a controlled semiconductor component having thyratron character. Said three-zone transistor can be brought to conduct current in both directions but must be controlled continuously. On the other hand, the PNPN switch is self-holding but has a good conductivity only in one direction.

The object of the present invention is to produce a self-holding device of this type which has a good conductivity in both directions.

The action of a nonsymmetrical four-zone switch of the type PNPN or NPNP has been described, inter alia, by Moll et al. in Proceedings of Institute of Radio Engineering (PIRE), New York, 1956, pages 1174–1182.

This known type and other novel types of multijunction types of semiconductors will now be described with reference to the accompanying drawings on which:

Figure 2:
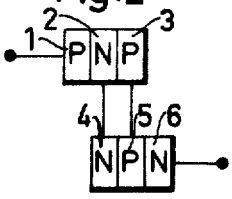

In FIG. 2 there is an upper composite device having three zones PNP designated 1, 2 and 3 an a lower composite device having three zones NPN designated 4, 5 and 6. Interconnections are provided between zones 2 and 4 and between zones 3 and 5.

Figure 1:
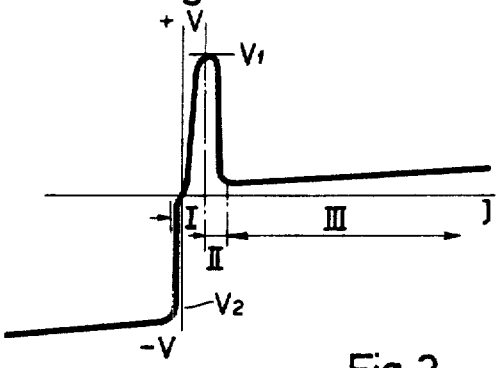
FIGS. 1 and 2 are diagrammatic representations of a four-zone switch.

If the extreme P zone 1 in FIG. 2 is subjected to a positive potential in relation to the extreme N zone 6 this will be considered to be the forward direction in FIG. 1 and the corresponding characteristic is plotted on the right hand side of the ordinate axis in FIG. 1. Within a first section I the system acts as a barrier up to the break-over voltage $V_1$. Then there will be a breakdown of the NP barrier 2, 4 and 3, 5 and the current will increase and the voltage decrease within a section II. The current may then further increase in section III while the voltage drop increases but slightly. Section III indicates thus the "on-state." The transition from the off-state in section I to the on-state section III may be produced by supplying control current to one of the two central zones 2, 4 and 3, 5 or by forcing the traversing current to exceed a certain critical value $I_{min}$. As illustrated in FIG. 2 a PNPN element may be considered to consist of two triple-zone transistors, i.e., one PNP transistor and one NPN transistor. For each one of these part transistors a current amplification factor $\alpha$ may be defined as follows.

$$\alpha_{pnp}=\frac{\text{collector current}}{\text{emitter current}} \text{ for the PNP transistor}$$

$$\alpha_{npn}=\frac{\text{collector current}}{\text{emitter current}} \text{ for the NPN transistor}$$

Moll et al. state that the condition for the switching over of the PNPN element from the off-state in section I to the on-state in section III is that $$\alpha_{pnp}+\alpha_{npn} \text{ is larger that } 1 \qquad (A)$$

The values $\alpha$ depend on the current traversing the PN junctions. Normally at weak currents the sum $\alpha_{pnp}+\alpha_{npn}$ is much less than 1 but increases with increasing currents so that, when a definite current $I_{min}$ is reached, the condition (A) is complied with.

The voltage drop in the on-state in section III is of the same order as that of a simple semiconductor PN diode. The break-over voltage $V_1$ of FIG. 1 is determined primarily by the barrier voltage in the central PN junctions 2–3 and 4–5. The normal barrier voltage $V_2$ will be the sum of the barrier voltages of the PN junctions 1–2 and 5–6. By selecting the resistivity of the material in any of the central zones sufficiently high and the width of the zone sufficiently large, PNPN elements are obtainable having a break-over voltage $V_1$ high up in the kilovolt range. In view of the currents which will traverse the device in its on-state it should be noted that the zone of high resistivity must not be made too thick in view of the resulting considerable current losses.

Figure 3:
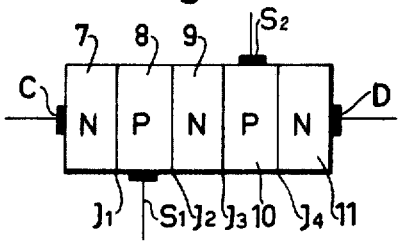
FIG. 3 illustrates a five-zone device having four PN junctions.

The five-zone device of FIG. 3 comprises four PN junctions $J_1$, $J_2$, $J_3$ and $J_4$ and is provided with main terminals, marked C and D, and, if desired, control terminals $S_1$ and $S_2$. Further, as the case may be, a terminal not shown may be provided at the central zone 9 for special purposes.

The five-zone device is based on the above mentioned properties of a PNPN device but by adapting the extreme PN junctions $J_1$ and $J_4$ in the manner explained below it is possible to provide that the five-zone device can be switched into an on-state for current in either direction.

If in FIG. 3 a positive potential is applied to zone 7 via terminal C and a negative potential to zone 11 via terminal D the zones 8, 9, 10 and 11 will constitute together a PNPN element polarized in preparation of its future forward direction. In series therewith is now the left hand N zone 7. In the boundary between this N zone 7 and the PNPN element 8, 9, 10, 11 the PN junction $J_1$ will be polarized in its normal reverse direction.

The right hand junction $J_4$ should satisfy the requirements on a PNPN element, i.e., its $\alpha$-value should be sufficiently high to provide that said junction primarily injects electrons into the P zone 10 upon being traversed by currents larger than the critical value $I_{min}$ in its forward direction. In case also the junction $J_2$ should primarily inject holes into the central zone 9 it must satisfy similar conditions relating to its $\alpha$-value.

To obtain a low total voltage when the PNPN part 8, 9, 10, 11 is in its on-state the extreme PN junction $J_1$ should be made with a very low barrier voltage If in FIG. 3 a positive potential is applied to zone 11 via terminal D and negative potential to zone 7 via terminal C the four left hand zones 7, 8, 9 and 10 will act as a PNPN part polarized in its forward direction. In series therewith is the right hand N zone 11. The PN junction $J_4$ will be polarized in its normal reverse direction.

The left hand junction $J_1$ should now satisfy the requirements in respect of a PNPN element, i.e., its $\alpha$-value should be sufficiently high to provide that said junction primarily injects electrons into the P zone 8 upon being traversed by currents larger than the critical value $I_{min}$ in its forward direction.

At the same time the PN junction $J_3$ should primarily inject holes into the central N zone 9. The junction $J_4$ should now operate in its reverse direction having a low barrier voltage.

Summarizing, following conditions will enhance the operation of a self-holding five-zone switch having a good conductivity in both directions.

(1) The device should be symmetrically built up on both sides of a central zone the left hand half being a mirror image of the right hand half.

(2) Upon being traversed by currents exceeding a certain minimum value in their forward direction, the junctions $J_1$ and $J_4$ should inject carriers from the outer zones to the corresponding adjacent inner zones.

(3) Upon being subjected to voltages in their reverse direction, the junctions $J_1$ and $J_4$ should afford a low total resistance.

(4) Upon being traversed by currents exceeding a certain minimum value the junctions $J_2$ and $J_3$ should inject carriers to the central zone.

A further condition is this:

(5) Upon being subjected to voltages in their reverse direction, the junctions $J_2$ and $J_3$ should afford a high total resistance.

This desiredatum can be realized by making the central zone 9 of such a thickness and of a substance having such a basic resistivity that condition (5) is complied with.

For instance, by applying a proper alloying or diffusion process, or by applying a proper vapour or epitaxial growth process, the adjacent zones 8 and 10 will obtain a low basic resistivity of the opposite type of conduction and if said zones are made with a proper thickness in relation to the lifetime of the carriers, i.e., the electrons and holes, sufficiently high $\alpha$-values will be obtained to comply with condition (A) upon being traversed by the current $I_{min}$. In view of the low resistivity of said zones 8 and 10 in relation to that of the central zone 9 condition (4) will be complied with.

To comply with conditions (2) and (3) the extreme zones 7 and 11 are made with a still lower resistivity than the adjacent interior zones 8 and 10 so that conditions are favourable for an injection. Further, if the PN junctions $J_1$ and $J_4$ are made very abrupt in contradistinction to normal or less abrupt PN junctions they will afford a low apparent resistance in the reverse direction. The right hand diagram of FIG.5a illustrates the characteristic for such a reversed PN junction *or backward diode junction.*

Figure 5A:
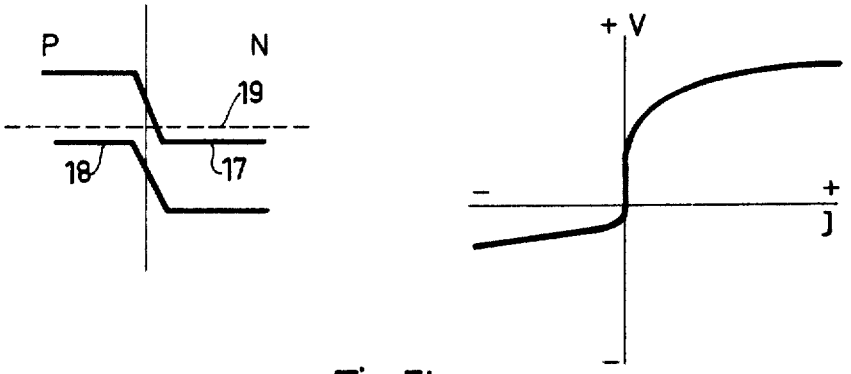
FIGS. 5a to 5c illustrate diagrammatically the conditions in a PN junction.
Figure 5B:
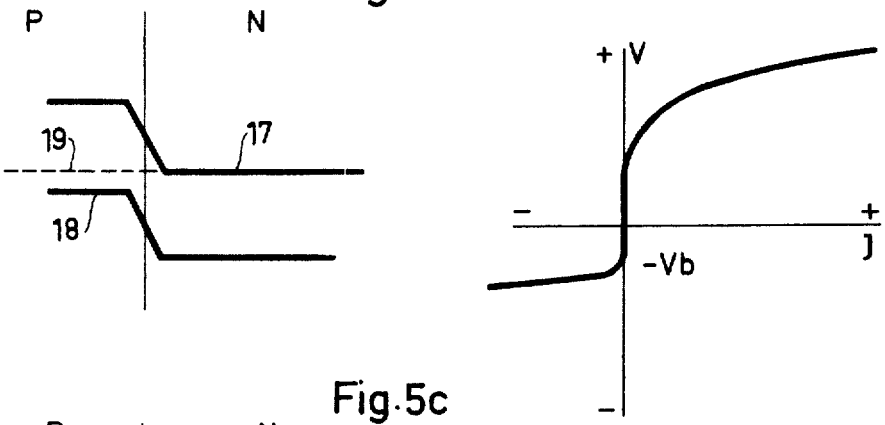
Figure 5C:
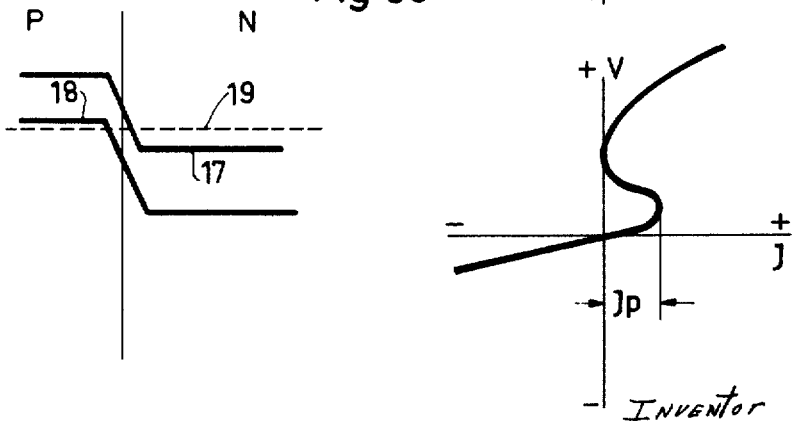

Also a diode having a characteristic according to the right hand part of FIG. 5c relating to a so called Esaki diode has a low resistance in the reverse direction and complies with condition (2) provided only the desirable minimum current $I_{min}$ is larger than the peak current $I_p$ of the Esaki diode. Reference is made to an article of Esaki, Physical Review 109, 603 (1958).

To obtain this known effect the thickness of the PN junction should be 100 to 200 Angstrom units and the resistivity in the two zones be so low that in the energy band scheme to the left in FIG. 5a relating to the junctions $J_1$ and $J_4$ the upper edge 18 of the valence band on the P side will be on level with, or somewhat higher than, the lower edge 17 of the conduction band on the N side. In this figure the so called Fermi level is designated 19. (Reference is made to William Shockley, "Electrons and Holes in Semi-conductors," Van Nostrand Co., New York, 1950.) In a thorough analysis of this question due attention should also be paid to the energy levels of the impurities adjacent the band edges 17 and 18. At the relatively high concentrations of impurities of interest in this case it may occur that said energy levels and band edges overlap one another. The efficient positions of the band edges are then somewhat displaced but this fact makes no principal difference. If the levels of the band edges 17 and 18 are displaced by the application of reverse voltage on the PN junction a low apparent resistance is obtained due to the fact that the electrons in the valence band, on account of the so called tunnel effect, can directly enter free energy levels in the conduction band.

If the energy distance between the edge 18 on the P side and the edge 17 on the N side is larger, for instance as shown to left in FIG. 5b, the band edges will come into level with one another only upon application of a reverse voltage which means that the low apparent resistance will occur only when a certain reverse voltage $V_b$ has been exceeded.

If the band edges overlap one another as shown to the left in FIG. 5c the Esaki effect is obtained including a negative characteristic in the forward direction of the diode and a typical peak current $I_p$ at low drop of voltage in the direction of good conductivity as shown to the right in FIG. 5c.

To obtain a good injection action at forward voltages over the junctions $J_1$ and $J_4$ the PN junctions should be nonsymmetrical so that the diffusion currents then occurring are dominated by electrons as in the present instance relating to a NPNPN switch. This means that, primarily, the N side should be more intensely doped than the P side and that, secondly, the thickness of the N zone must not be too small or the lifetime of the carriers on the N side not too short. Similar conditions have already been applied, for instance, to transistors and non-symmetrical PNPN switches.

Above is described the structure and function of a NPNPN switch. Apparently, similar conditions relate also to a PNPNP switch provided attention is paid to the fact that electrons and holes and polarities should be exchanged in a proper way.

Figure 4:
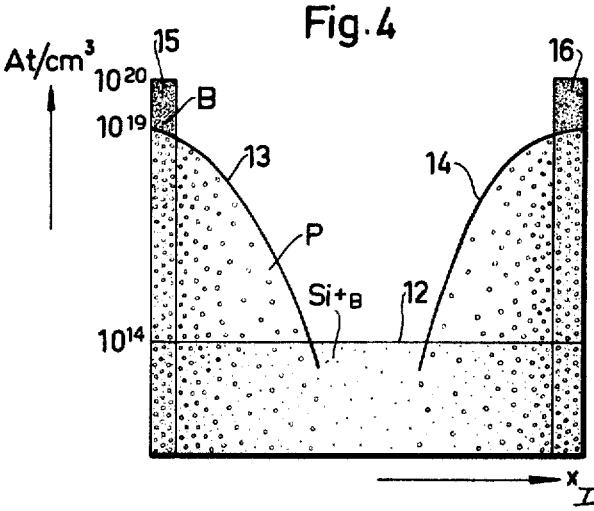
FIG. 4 illustrates diagrammatically the composition of the device of FIG. 3.

A method for making a symmetrical NPNPN or PNPNP switch according to the present invention is to start with a plate of highly resistive mono-crystalline silicon or other semiconductor material and of a thickness of, for instance, 200 microns. Then a doping substance of the opposite type of conductivity is diffused on both sides of the plate onto a suitable depth therein. On both sides a thinner zone of the same conductivity type as that of the central zone is then alloyed or diffused into the plate on the outside of the initially diffused zones until a concentration of impurity according to the conditions above described is reached. The device may then have a distribution of impurities as indicated, by way of example, in FIG. 4 in which the vertical scale indicates the concentration in number of atoms per cubic centimeter and the horizontal scale the position of the point considered between the flat surfaces of the silicon plate. The central layer is assumed to be about 100 microns thick and consists of silicon having boron as impurity with a concentration of $10^{14}$ atoms per cm.$^3$ as indicated by the line 12. As an impurity having the opposite conductivity type phosphorus is used which penetrates into the semiconductor onto the curves 13 and 14 respectively. Depending on the depth the concentration will thus decrease from $10^{19}$ atoms per cm.$^3$ at the flat surfaces down to a value of $10^{14}$ atoms per cm.$^3$ at a distance of about 50 microns from the flat surfaces of the silicon plate. Adjacent said surfaces of the plate there are thinner zones being about 1 to 10 microns thick and having a concentration of about $10^{20}$ boron atoms per cm.$^3$ according to the lines 15 and 16.

Figure 6:
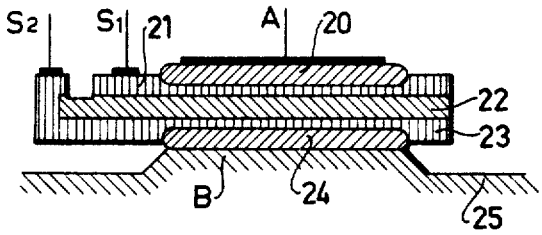
FIGS. 6 and 7 are structural sections through five-zone devices.

According to FIG. 6 a practical embodiment of the invention may have the section as indicated principally if the element is to be composed by a process of diffusion and alloying. This element is of PNPNP type. The principal composition of the starting plate is silicon having a boron addition of a concentration of $10^{14}$ atoms per cm.$^3$. A layer 20 of P conductivity type is obtained by allowing a boron-aluminium alloy onto the silicon plate which has three zones, 21, 22, 23. An electrode A is provided in contact with the outside of layer 20. The recrystallized zone of the silicon plate obtains in this way a boron content of about $10^{20}$ boron atoms per cm.$^3$. The aluminium content is lower but aluminium is required only in order to render possible the alloying process. The zone 21 is of N conductivity type and has been made by diffusion of phosphorus into the semiconductor plate resulting in a superficial concentration of $10^{19}$ phosphorus atoms per cm.$^3$ at the junction with the layer 20. The zone 22 is of P conductivity type having the composition of Si+boron as impurity. The zone 23 of N conductivity type is made in a way similar to that of zone 21. The zone 24 is of a nature similar to that of the zone 20. The zone 24 is made with a wide contact surface against a supporting metal piece B, such as of molybdenum or copper. Control electrodes S1 and S2 are connected to the zones 21 and 23.

Figure 7:
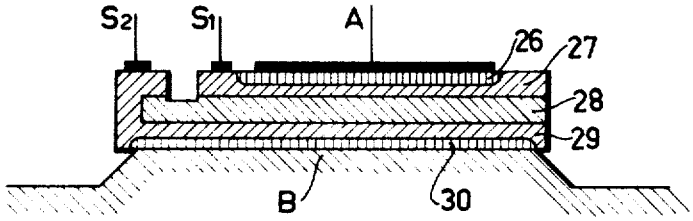

The embodiment of FIG. 7 is suitable if only diffusion is to be used in the manufacture. In this case an element of NPNPN type is selected as an example. The starting material has the fundamental composition of silicon with the addition of phosphorus up to a concentration of $10^{14}$ atoms per cm.$^3$. After the silicon plate has obtained a suitable thickness, such as 200 microns, boron has been diffused into the plate onto a depth of 50 microns with a superficial concentration of about $10^{19}$ atoms per cm.$^3$. In this way the central N zone 28 is confined by two P conducting zones 27 and 29. Then phosphorus is diffused into the plate in a very thin zone up to a superficial concentration of about $10^{20}$ atoms per cm.$^3$. In this way the N conductive zones 26 and 30 are obtained.

In a way conventional in the art of semiconductor elements, nondesirable short circuits along the edges of the element are removed by etching or similar processes.

Figure 8:
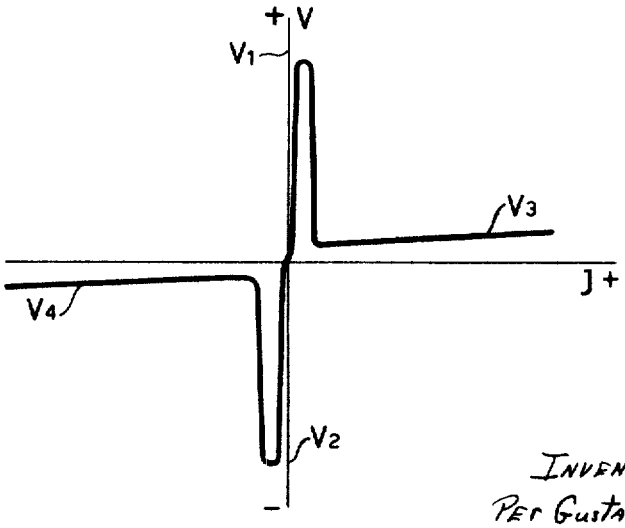
FIG. 8 shows the characteristics of the five-zone device.

The electric characteristic for a NPNPN switch is shown in FIG. 8 in which break-over voltages V1 and V2 of at least 50 volts and preferably of about 1000 volts are obtained. The drops of voltage V3 and V4 will be at most 5 volts and preferably have the order of 1 to 2 volts in the case of silicon. The current carrying capacity will be about 100 amperes per cm.$^2$ of the effective crystalline surface.

The switching from the off-state to the on-state is preferably caused by means of the control contacts S1 and S2. By impressing a forward voltage between A and S1 the device will be highly conducting in the one direction whereas a forward voltage applied between contacts B and S2 makes the element conducting in the opposite direction.

In the above description the figures for the concentrations are given only by way of example. Also the process of manufacture may be varied and the invention is only restricted by the claims appended to the specification.

What is claimed is:

[1. A semiconductor device of the switch type having five semiconductor zones of alternating P- and N-conducting type arranged symmetrically and having substantially symmetrical characteristics in both directions and having junctions between each two adjacent zones, said zones being doped with impurities of different concentrations in different zones, the concentration being lowest in the central zone and highest in the outer zones and, in the intermediate zones, of a value between said highest and said lowest values.]

[2. The semiconductor device of claim 1, in which the concentration of the doping substance in the intermediate zones has its highest value adjacent the outer zones and its lowest value adjacent the central zone.]

*3. A semi-conductor device of the switch type having five semi-conductor zones of alternately P- and N-conducting type arranged symmetrically and having substantially symmetrical characteristics in both directions and having junctions between each two adjacent zones, said zones being doped with impurities of different concentrations in different zones, the concentration being lowest in the central zone and highest in the outer zones and, in the intermediate zones, of a value between said highest and said lowest values, the distribution of said doping impurities at the junctions between said outer zones and said intermediate zones being such, that the thickness of the barrier layer at said last-mentioned junctions is approximately 100–200 Angstrom units and that, when said last-mentioned junctions are unbiased, the upper edge of the valence band on the P-conducting side of said junctions is at an energy level which is at least as high as the energy level of the lower edge of the conduction band on the N-conducting side.*

*4. The semi-conductor device of claim 3, in which the concentration of the doping substance in the intermediate zones has its highest value adjacent to the outer zones and its lowest value adjacent to the central zone.*

*5. A semi-conductor device of the switch type having five semi-conductor zones of alternating P- and N-conducting type arranged symmetrically and having substantially symmetrical characteristics in both directions and having junctions between each two adjacent zones, said zones being doped with impurities of different concentrations in different zones, the concentration being lowest in the central zone and highest in the outer zones and, in the intermediate zones, of a value between said highest and said lowest values, the distribution of said doping impurities at the junctions between said outer zones and said intermediate zones being such, that the thickness of the barrier layer at said last-mentioned junctions is approximately 100–200 Angstrom units and that, when said last-mentioned junctions are unbiased, the upper edge of the valence band on the P-conducting side of said junctions is at an energy level which is substantially at least as high as and substantially the same as the energy level of the lower edge of the conduction band on the N-conducting side.*

*6. The semi-conductor device of claim 4, in which the concentration of the doping substance in the intermediate zones has its highest value adjacent to the outer zones and its lowest value adjacent to the central zone.*

References Cited

The following references, cited by the Examiner, are of record in the patented file of this patent or the original patent.

UNITED STATES PATENTS

| | | | |
|---|---|---|---|
| 2,980,810 | 4/1961 | Goldey | 317—235 |
| 2,983,854 | 5/1961 | Pearson | 148—33.1 X |
| 3,046,459 | 7/1962 | Anderson et al. | 148—33.1 X |
| 3,123,750 | 3/1964 | Hutson et al. | 317—235 |
| 2,898,454 | 8/1959 | Loughlin. | |
| 2,927,204 | 3/1960 | Wilhelmsen. | |
| 2,966,434 | 12/1960 | Hibberd. | |
| 2,980,810 | 4/1961 | Goldey. | |
| 2,988,677 | 6/1961 | Miller. | |

FOREIGN PATENTS

| | | |
|---|---|---|
| 1,079,312 | 4/1960 | Germany. |

CHARLES N. LOVELL, *Primary Examiner.*